United States Patent [19]

Amelio et al.

[11] Patent Number: 4,786,528

[45] Date of Patent: Nov. 22, 1988

[54] PROCESS FOR TREATING REINFORCED POLYMER COMPOSITE

[75] Inventors: William J. Amelio, Austin, Tex.; Voya Markovich, Endwell, N.Y.; William J. McCarthy, Binghamton, N.Y.; Allen F. Moring, Endicott, N.Y.; Peter A. Moschak, Chenango Forks, N.Y.; Douglas H. Strope, Apalachin, N.Y.

[73] Assignee: International Business Machines Corporation, Armonk, N.Y.

[21] Appl. No.: 864,978

[22] Filed: May 20, 1986

[51] Int. Cl.$^4$ .......................... B05D 3/02; B05D 3/12
[52] U.S. Cl. .................................. 427/289; 156/306.9; 427/290; 427/315; 427/316; 427/444
[58] Field of Search ............... 427/316, 322, 444, 289, 427/290, 306, 377, 386, 387, 389.9, 393.5, 315, 383.1; 156/288, 253, 298, 313, 323, 306.9, 306.3

[56] References Cited

U.S. PATENT DOCUMENTS

| | | | |
|---|---|---|---|
| 3,258,387 | 6/1966 | Brown et al. | 428/208 |
| 3,523,037 | 8/1970 | Chellis | 427/386 |
| 3,682,785 | 8/1975 | Russo | 427/322 |
| 3,925,138 | 12/1975 | Shaul et al. | 427/322 |
| 4,191,800 | 3/1980 | Holtzman | 428/251 |
| 4,374,893 | 2/1983 | Arsac et al. | 427/322 |
| 4,410,388 | 10/1983 | Oizumi et al. | 156/307.3 |
| 4,496,793 | 1/1985 | Hanson et al. | 428/251 |
| 4,582,564 | 4/1986 | Shanefield et al. | 427/306 |

OTHER PUBLICATIONS

Goodman et al., "Preconditioning of Polyurethane Materials" *IBM Technical Disclosure Bulletin*, vol. 13, No. 1, Jun. 1970.

Chellis et al., "Signal Core by Direct Circuit Deposition", *IBM Technical Disclosure Bulletin*, vol. 27, No. 5, Oct. 1984.

Pohl et al., "Producing and Jointly Processing Base Laminates for Multilayer Printed Circuit Cards", *IBM Tech. Disclosure Bulletin*, vol. 27, No. 8, Jan. 1985.

*Primary Examiner*—Sadie Childs
*Attorney, Agent, or Firm*—Pollock, Vande Sande & Priddy

[57] ABSTRACT

Reinforced synthetic polymer composite is treated by heating at a temperature and for a time sufficient to obtain a moisture content below that for the relative humidity level at which the composite is to be drilled and/or photoresist exposed; and then subjecting it to conditions to increase the moisture content to that for the relative humidity level of the drilling.

16 Claims, No Drawings

PROCESS FOR TREATING REINFORCED POLYMER COMPOSITE

DESCRIPTION

1. Technical Field

The present invention is concerned with a method for treating reinforced synthetic polymer composites. Of particular interest is a process for treating so-called prepreg polyepoxide substrates.

2. Background Art

A number of reinforced plastics are used commercially for various purposes. Articles such as sheets, tapes, or fabrics wherein reinforcing materials such as fibers are impregnated with a resin such as an epoxy resin, are referred to as "prepreg substrates". One important use of prepreg substrates is to provide a surface upon which a pattern of an electrical conductor can be provided to obtain circuit boards or circuit cards.

In the manufacture of the printed circuit cards and boards a conductive circuit pattern is provided on one or both of the major surfaces of the substrate. In addition, in order to provide electrical connection between layers, metal coated through-holes are provided.

In the manufacture of such composites, it is important that the holes provided in the various prepreg substrates be capable of lining up with the through-holes in other substrates which are to be laminated together with each other. However, at times there is through-hole mismatch between substrates which are to be laminated together and, therefore, some substrates need to be discarded. Also, it is important that electrical patterns be reliably reproduced on a substrate so that products from batch to batch are uniform. Also it is necessary to reliably match the through-hole and photoresist pattern in order to prevent hole to line mismatch on any single substrate.

In order to achieve these objectives, it would be desirable to provide prepreg substrates which are relatively dimensionally stable.

SUMMARY OF INVENTION

In accordance with the present invention the behavior of reinforced polymer composites with respect to dimensional stability is reliably controlled. In accordance with the present invention the prepreg composites which are to be combined in forming a final product are treated so that such exhibit the same level of moisture and, thereby, exhibit the same degree of dimensional stability.

Although it would seem desirable that the composites be completely dry prior to processing, such as drilling and photoresist exposure, such is not very practical. In particular, prepregs, prior to these operations, once made, will be stored for varying periods of time.

Under normal storage conditions, completely dry composites will absorb moisture, the extent of which will depend upon the conditions and time of storage. Therefore, using completely dry composites requires conditions of processing that are not especially practical in a manufacturing operation.

In accordance with the present invention a method is provided for treating a reinforced synthetic polymer composite. The method includes heating the composite at a temperature and for a time sufficient to obtain a moisture content below that for the relative humidity level at which the composite is to be subjected to drilling at a subsequent time.

Next, the composite is subjected to a controlled environment having the same relative humidity and temperature conditions as that for the subsequent drilling. The composite is subjected to such conditions for a time sufficient to increase the moisture content of the composite to that for the relative humidity level.

BEST AND VARIOUS MODES FOR CARRYING OUT INVENTION

Dielectric substrates or materials that can be included in the composites treated in accordance with the present invention include thermoplastic and thermosetting resins. Typical thermosetting resinous materials include epoxy, phenolic-based materials, polyimides, and polyamides. Such materials are usually molded of the resinous material along with a reinforcing agent such as being a glass-filled epoxy or phenolic-based material. Examples of some phenolic-type materials include copolymers of phenol, resorcinol, and cresol. Examples of some suitable thermoplastic polymeric materials include polyolefins such as polypropylene, polysulfones, polycarbonates, nitrile rubbers, and ABS polymers.

The preferred polymeric materials employed in the present invention are thermosetting polymers and most preferably are the epoxy polymers.

Typical epoxy resins include bisphenol A type resins obtained from bisphenol A and epichlorohydrin, and from brominated bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as polyglycidyl ethers of tetraphenylene and tetraglycidyldiaminodiphenyl methane, and alicyclic epoxy resins such as bis(3,4-epoxy-6-methyl-cyclohexyl-methyl) adipate. The most preferred epoxy employed is of the brominated bisphenol A type. In addition, mixtures of epoxy resins can be employed when desired.

The epoxy resinous compositions also can contain curing agents and accelerating agents as well-known in the art.

Examples of suitable curing agents include anhydrides such as chlorendic anhydrides, nadic anhydride, methyltrimellitic anhydride; carboxylic acids; polyamides; polysulfides; urea-phenolformaldehydes; polyamines; primary, and secondary, and tertiary amines. The preferred curing agent in the preferred epoxy compositions employed in the present invention is dicyandiamide. Moreover, mixtures of such with tertiary amines provide for faster curing rates. Such tertiary amines include benzyldimethyl amine, α-methyl benzyldimethyl amine, dimethylaminomethylphenol, tris(dimethylaminomethylphenol), and N,N,N',N'-tetramethyl-1,3-butanediamine.

In addition, the epoxy resin is generally applied in the form of a solution in a suitable organic solvent. Suitable solvents include ketones such as acetone and methylethyl ketone; ethers such as ethylene glycol monomethyl ether; and dimethylformamide.

Moreover, various suitable epoxy compositions are disclosed in U.S. Pat. No. 3,523,037, disclosure of which is incorporated herein by reference.

In general, these epoxy compositions are comprised of an epoxy resin having a high functionality of from about 3.5 to about 6, a second epoxy resin having a relatively low functionality of about 1.7 to about 2, a curing agent, and a curing catalyst such as a tertiary amine. The second epoxy resin may be halogenated or non-halogenated.

In a more usual aspect, such compositions contain a brominated epoxy resin in an amount of about 70 to about 92 parts and more usually about 88 to about 91 parts per hundred parts by weight of the resin solids in the composition; a tetrafunctional epoxy resin in an amount of about 8 to about 30 parts and more usually about 9 to about 12 parts by weight per hundred parts by weight of the resin solids in the composition; dicyandiamide in a amount of about 3 to about 4 parts by weight per hundred parts by weight of solids in the composition; about 0.2 to about 0.4 parts by weight per hundred parts by weight of solids in the composition of a tertiary amine; about 40 parts by weight based upon the total weight of the composition of ethylene glycol monomethyl ether; and methylethyl ketone in an amount necessary to provide a specific gravity of about 1.085±0.005 to the composition.

The brominated epoxy resin is based on polyglycidyl ether of tetrabromobisphenol A and can be prepared from tetrabromobisphenol A and epichlorohydrin. Such has a functionality of about 2, an epoxide equivalent weight of about 455 to about 500, and a bromine content of about 19% to about 23% by weight. Such can be obtained under the trade designation Araldite 8011 from CIBA Products Company as a solution containing about 75% epoxy resin by weight of methylethyl ketone. Also, such can be obtained under the trade designation DER-511 from the Dow Chemical Company as an 80% solution of the resin in methylethyl ketone.

The tetrafunctional epoxy resin is the polyglycidyl ether of tetraphenylene and is prepared from tetra bis (hydroxyphenyl) ethane and epichlorohydrin. The epoxy resin has an average functionality of about 4 and an epoxide equivalent weight of about 210 to about 240. Such is available under the trade designation Epon 1031 from the Shell Chemical Corporation as a solution containing about 80% by weight of solids in methylethyl ketone. Such is also available under the trade designation Araldite 0163 from CIBA Geigy Company. Other suitable multifunctional epoxies are epoxidized novolak such as CIBA 12XX series and Dow 4XX series.

The reinforcing materials can be fibrous substrates such as fiberglass, polyamides, and graphite. The preferred fibrous substrates are fiberglass or woven glass fabric.

Examples of some glass fabrics available include those having the standard designations 1675, 116, 7628, 108, and 1080.

In order to enhance the adhesion between the fibrous substrate and synthetic polymer, the fibrous substrate can be coated with a silane such as a monolayer.

Typical organofunctional groups found in the silanes include the vinyl, epoxy, methacrylate, amine, and styryl amine groups. The silane coupling agents are well-known in the art. Examples of some specific silanes which are suitable are gamma glycidoxypropyltrimethoxy silane, available under the trade designations Dow Corning Z6040 and Union Carbide A187; N-beta (aminoethyl)-gamma aminopropyltrimethoxy silane, available under the trade designation Union Carbide A1120; vinyltriethoxy silane; (beta-3,4-epoxycyclohexyl)-ethyltrimethoxy silane; and N (vinylbenzylaminoethyl) gamma aminopropyltrimethoxy silane, available under the trade designation Dow Corning Z6032. Mixtures of silanes can be employed if desired.

The silanes are generally applied to the fibrous substrates by preparing solutions of such in water and then contacting the substrates with the solutions. The silanes are hydrolyzed when placed in aqueous acidic media of suitable pH range.

Suitable organo silanes can be represented by the following formula:

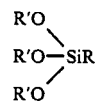

wherein R' is a hydrocarbon group and usually an alkyl of 1–6 carbon atoms and preferably 1–2 carbon atoms and R is an organo-substituted alkyl radical such as amino- and/or epoxy-substituted alkyl radical in which the alkyl groups have from 1–6 carbon atoms. After the silane is hydrolyzed, the fibers such as glass fabric commonly about 2 mils to about 10 mils in thickness is impregnated with the hydrolyzed silane such as by dipping the fabric through an aqueous solution of the aminosilane in its hydrolyzed form.

During the coating of the fabric, the pH of the silane solution should be between about 3.4 and about 4.5 for best results.

Since alkali is normally present on the glass when received, the pH of the silane solution during the coating procedure, can shift upwards from the pH required during the hydrolysis due to dissolution of the alkali therein. For best results, the pH of the amino silane solution should be maintained throughout the coating in the desired range which can be accomplished by limiting the time any particular silane solution is used, or by adding additional acid during use to the silane solution, or by prewashing the glass substrate to remove alkali which is normally present.

After the glass cloth is removed from the aqueous silane composition, excess material not impregnated into the fibers can be removed by squeezing the fabric between doctor rolls.

The glass cloth containing the silane coating is then dried in an oven at temperatures between about 38° C. and about 177° C. and preferably between about 116° C. and about 121° C. to remove water and cause the desired polymerization of the silane. The residence time in the oven is about 5 seconds to about 7 minutes and preferably about 7 to about 10 seconds.

The fibers containing the silane are then coated with the desired polymer composition.

The amount of polymer employed is about 25% to about 65% by weight of polymer solids based upon the glass fabric. The glass fabric is coated with the polymer composition such as the epoxy composition in the same manner as disclosed in U.S. Pat. No. 3,523,037, disclosure of which is incorporated herein by reference.

In particular, when an epoxy is employed, the fabric is directed into a container containing the epoxy composition. After being impregnated, the fabric is then passed through a pair of doctor rolls whereby excess epoxy resin solution is removed from the surface of the woven fabric.

After combining with the reinforcing fibers, the epoxy composition is then cured to the B-stage and molded to the desired shape, such as a sheet.

When sheets are employed, the thickness is usually about 1.5 mils to about 8 mils and preferably about 2 mils to about 5 mils.

The curing to the B-stage is generally achieved by using temperatures between about 93° C. and about 177° C. and for times of about 3 minutes to about 10 minutes. The now impregnated fabric or prepreg can be divided into sheets of desired size in preparation for lamination to form the printed circuit board. The number of sheets of prepreg in any given laminate will depend upon the thickness and weight per unit area of the original glass cloth, the ratio of resin to glass in the prepreg, laminating pressure, and other factors. The number of sheets may vary from 1 to 20 or more, depending on the above factors. Typically, about 2 sheets of the prepreg are interleaved between sheets of electrolytic copper foil and placed between two polished metal plates.

This assembly of prepregs and metal plates and copper foils is then placed between platens of a laminating press. The platens are cored for steam or super-heated water so that they can be heated to elevated temperatures.

The above assembly is subjected to pressures which may vary from about 50 psi to about 2000 psi, depending upon the resin content, flow of the prepreg, and laminate temperatures. Preferably, the pressures are about 200 psi to about 500 psi and most preferably about 250 psi to about 300 psi. The laminate temperature is preferably about 150° C. to about 200° C.

The time of the pressing operation is variable, depending upon the particular materials employed and the pressure applied. About 1 hour is adequate for the above conditions.

In order to connect electrically conductive patterns to be provided on opposing surfaces of the dielectric material, through-holes in the structure are required. The through-holes can be obtained by drilling or punching operations including mechanical drilling and laser drilling.

In general, the copper foils are removed prior to drilling from the assembly by peeling or etching in a suitable etchant.

In accordance with the present invention, however, prior to the drilling it is necessary to heat the reinforced, synthetic polymer composite at a temperature and for a time sufficient to obtain a moisture content that is below that for the relative humidity level at which the composite is to be subjected in the drilling operation. In preferred aspects of the present invention the heating is such as to reduce the moisture content of the composite to a level below that which would exist at about 35% to about 55% relative humidity and preferably at a value below about 45% relative humidity. The maximum temperature for heating is below the glass transition temperature of the polymer of the composite and preferably is about 110° C. Temperatures between about 90° C. and 100° C. are preferably employed. The time that the composite is subjected to the elevated temperature is usually about ½ to about 2½ hours; typical of which is about 1½ hours. However, the time and temperature are inversely related. In particular, when the temperature is increased, then the time necessary to achieve the desired moisture level is decreased and vice versa. Also, the time of heating is dependent upon the thickness of the composite and upon the desired reduction in the moisture content at this stage.

Next, the composite is subjected to a controlled environment having the same relative humidity level as that to be employed in the drilling operation. The composite is maintained under such conditions for a time at least sufficient to increase the moisture content of the composite to that which would exist for the relative humidity level to which the drilling operation is conducted. In the preferred aspects of the present invention, the relative humidity level is about 35% to about 55% and most preferably about 45%. In order to assure that the desired level of moisture is achieved, the composites are generally maintained under these conditions for at least about 24 hours and preferably for at least about 48 hours. Of course, depending upon the relative thickness of the composite, this time requirement can be increased or decreased.

By controlling the moisture level in accordance with this sequence of steps, the amount of moisture present is reliably and reproducibly controlled, thereby achieving a predictable amount of linear expansion due to the moisture content from batch to batch.

Next, the through-holes are obtained. If desired, the dielectric substrate with the through-holes can be cleaned and preconditioned for subsequent plating thereon. For instance, the preconditioning can include creation of active sites by physical means such as sand and/or vapor blasting and/or chemical methods such as solvent swelling. A typical solvent is N-methyl pyrrolidone.

The holes upon which metal is to be plated for electrical connection between electrically conductive patterns on opposing surfaces if the dielectric substrate, as well as the dielectric substrate itself, must be catalytic for the deposition of the copper. For instance, a suitable catalyst is deposited in the through-holes and the dielectric substrate prior to contact with an electroless copper plating bath.

Among the more widely employed procedures for catalyzing or seeding a substrate is the use of a stannous chloride sensitizing solution and a palladium chloride activator to form a layer of metallic palladium particles. For instance, one method for catalyzing a dielectric substrate is exemplified by U.S. Pat. No. 3,011,920 which includes sensitizing the substrate by treating it with a solution of colloidal metal, accelerating the treatment with a selective solvent to remove protective colloids from the sensitized dielectric substrate, and then electrolessly depositing the copper onto the sensitized substrate.

Also, as suggested, for example, in U.S. Pat. No. 3,099,608, a dielectric substrate can be pretreated by depositing a thin film of "conductivator" type metal particles such as palladium metal from a semi-colloidal solution onto the dielectric substrate to provide a conducting base which permits electroplating with a conductive metal on the "conductivated" base.

Moreover, U.S. Pat. No. 3,632,388 suggests a method for treating a polymeric plastic substrate in the plating process which utilizes a preliminary chromic acid etch followed by one-step activation with a tin-palladium hydrosol.

More recently, U.S. Pat. No. 4,066,809 discloses the use of a so-called triple seeding technique. This technique includes contacting the surfaces of the dielectric substrate first with a stannous chloride sensitizing solution, then with a palladium chloride activator, and then with a palladium chloride/stannous chloride/ hydrochloride acid seeder bath.

In addition, prior to the stannous chloride and palladium chloride treatment, the substrate and through-holes can be treated with an aqueous solution containing a multifunctional ionic polymer, as disclosed in U.S. Pat. No. 4,478,883 to Bupp, et al. and U.S. Pat. No. 4,554,182 to Bupp, et al., disclosures of which are incorporated herein by reference.

The polymer is a multifunctional ionic material in that it contains at least two active or available ionic functional moieties of the same polarity. The polymers are at least water miscible and are preferably water soluble or at least soluble in the water compositions employed in the present invention. The preferred ionic moieties are cationic moieties such as quaternary phosphonium and quaternary ammonium groups. Polymers containing at least two ionic moieties are commercially available and need not be described herein in any detail. Examples of commercially available multifunctional cationic polymers are Reten 210, Reten 220, and Reten 300, available from Hercules, disclosures of which can be found in "Water Soluble Polymers", Bulletin VC-482A, Hercules Incorporated, Wilmington, Del. 19899, disclosure of which is incorporated herein by reference.

The Reten polymers are high molecular weight polymers (usually about 50,000 to about 1,000,000 or more) and have a main chemical backbone of polyacrylamide.

The ionic polymer is usually employed as a dilute aqueous solution of about 0.01% to about 1% by weight and more usually about 0.05% to about 0.5% by weight of the copolymer. The aqueous solution usually contains an inorganic acid such as $H_2SO_4$ or HCl to provide a pH of about 0 to about 7 and more usually a pH of about 0 to about 3. The acid is usually present in amounts of about 2% to about 10% by weight.

The treatment with the ionic polymer is generally about 1 minute to about 10 minutes.

After treating with the ionic polymer, if desired, the structure can be rinsed such as with deionized water in order to remove any excess polymer not absorbed in the through-holes.

Next, the through-holes and dielectric substrates are activated by contact with a composition containing a catalytic composition capable of initiating the electroless copper plating process. The compositions containing metal which can directly provide the catalytic sites or serve as a precursor which leads to the catalytic sites. The metal present may be in the elemental form, an alloy, or compound, or mixtures thereof. The preferred metal catalysts are precious metals such as gold, palladium, and platinum. In addition, it is possible to employ non-precious metals such as copper, nickel, cobalt, iron, zinc, manganese, and aluminum.

The most preferred catalyst is palladium. A typical palladium composition contains about 1.2 to about 2.5 grams per liter of a palladium salt which is preferably $PdCl_2$, about 80 to about 150 grams per liter of a stannous salt which is preferably $SnCl_2 \cdot 2H_2O$, and about 100 to about 150 milliliters pre liter of an acid which is preferably HCl. When HCl is provided in the form of a 37% HCl solution, about 280 to about 360 milliliters of the HCl solution is preferably employed.

The most preferred composition contains about 1.5 grams per liter of $PdCl_2$ and about 280 milliliters per liter of 37% HCl. The composition is usually maintained at a temperature of about 65° F. ±10° F.

A typical triple seeder process is disclosed, for instance, in U.S. Pat. No. 4,525,390 to Alpaugh, et al., disclosure of which is incorporated herein by reference.

The conditioned substrates can be washed with deionized water treated with dilute HCl and dried at elevated temperatures prior to the plating. In addition to these process steps, photoresist masks corresponding to the negative of the desired metal patterns are formed on the activated surfaces prior to plating or photoresists corresponding to the desired pattern by employing a positive photoresist may be formed on the activated surfaces prior to the plating.

However, in accordance with the present invention, in order to assure reliable reproducibility of the desired patterns, prior to exposing the photoresist to actinic radiation, the composite is treated in the same manner as was treated prior to the drilling of the holes in the composite. In particular, the composite is heated at a temperature and for a time sufficient to obtain a moisture content below that for the relative humidity level at which the composite is to be subjected to during the exposure and development steps for the photoresist. In preferred aspects of the present invention for composites having a thickness of about 6 to about 20 mils, typical of which is about 12 mils, the composite is heated at a temperature of about 90° C. to about 110° C. for about ½ hour to about 2½ hours, typical of which is about 1½ hours. It is preferred that the relative humidity level at this stage be reduced below 35% to about 55% relative humidity and most preferably below about 45% relative humidity.

After this, the composite is then subjected to a controlled environment having a relative humidity level the same as that for the subsequent exposure and developing steps. The composite is maintained under these conditions for a time sufficient to increase the moisture content of the composite to that for the relative humidity level. In preferred aspects of the present invention the relative humidity level, at this stage, is the same as that for the prior step of drilling (e.g. about 35% to about 55% relative humidity and preferably about 45% relative humidity). The minimum time for this second step is usually about 24 hours and more usually about 48 hours. However, the time will depend upon the particular thickness of the composite employed in order to achieve the desired relative humidity values. In particular, the thicker the composite, the longer the time to obtain the desired value and to assure that such is at the value for the subsequent exposure and developing steps of the photoresist.

Next, the through-holes are plated and conditioned substrates are coated with an electrically conductive metal such as nickel or copper by contacting the structure with an electroless plating bath.

The preferred metal employed is copper. Suitable copper electroless plating baths and their method of application are disclosed in U.S. Pat. Nos. 3,844,799 and 4,152,467, disclosures of which are incorporated herein by reference.

The copper electroless plating bath is generally an aqueous composition which includes a source of cupric ion, a reducing agent, a complexing agent for the cupric ion, and a pH adjustor. The plating baths also can contain a cyanide ion source and a surface-active agent.

The cupric ion source generally used is a cupric sulfate or a cupric salt of the complexing agent to be employed. When employing cupric sulfate, it is preferred to use amounts from about 3 to about 15 grams per liter and most preferably from about 8 to about 12 grams per liter. The most common reducing agent employed is formaldehyde which is generally used in amounts from about 0.7 to about 7 grams per liter and more usually about 0.7 to about 2.2 grams per liter. Examples of some other reducing agents include formaldehyde precursors or derivatives such as paraformaldehyde, trioxane, dimethyl hydantoin, and glyoxal; borohydrides such as alkali metal borohydrides (sodium and potassium borohydride) and substituted borohydrides such as sodium trimethoxy borohydride; and boranes such as amine borane, isopropyl amine borane, and morpholine borane. Hypophosphite reducing agents can also be used for electroless nickel and copper plating.

Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono(gamma)-lactone, modified ethylene diamine acetates such as N-hydroxy ethyl ethylene diamine triacetate. A number of other suitable cupric complexing agents are suggested in U.S. Pat. Nos. 2,996,408; 3,075,855; 3,075,856; and 2,938,805. The amount of cupric ions present in the solution is generally from about 20 to about 50 grams per liter or in a 3-4 fold molar access. Moreover, the plating bath generally contains a surfactant which assists in wetting the surfaces to be coated. A satisfactory surfactant is, for instance, an organic phosphate ester, available under the trade designation Gafac RE-610. Generally, the surfactant is present in amounts from about 0.02 to about 0.3 grams per liter. In addition, the pH of the bath is also usually controlled, for instance, by the addition of a basic compound such as sodium hydroxide or potassium hydroxide in the desired amount to achieve the desired pH. The preferred pH of electroless copper plating baths is usually between about 11.6 and about 11.8.

Moreover, the plating bath can also include a cyanide ion and most usually about 10 to about 25 milligrams per liter to provide a cyanide ion concentration in the bath within the range of about 0.0002 to about 0.0004 molar. Examples of some cyanides include the alkali metal, alkine earth metal, and ammonium cyanides.

The specific gravity of such plating baths is generally in the range of about 1.060 to about 0.080. Moreover, the temperature of the copper electroless plating baths is usually between about 70° C. and about 80° C. and more usually between about 70° C. and about 75° C. For a discussion of suitable plating temperatures along with cyanide ion concentration discussion see U.S. Pat. No. 3,844,799.

In addition, the various prepregs treated in accordance with the present invention prior to laminating to other prepregs for further assurance of reliability can be stored in the same environment as the composites were stored prior to the drilling and/or step of exposing the photoresist. For instance, the prepregs can be stored at relative humidities of about 35% to about 55% and preferably at about 45% for at least about 24 hours and more usually for at least about 48 hours prior to subsequent lamination with other prepregs in the formation of a final product.

The following non-limiting examples are presented to further illustrate the present invention.

EXAMPLE 1

An epoxy-fiberglass prepreg about 12 mils thick is heated at about 110° C. for about 1.5 hours. This reduces the moisture content of the prepreg composite to below about 45% relative humidity to a level of less than 400 ppm of moisture. Next, the prepreg is maintained at about 20° C. at a relative humidity of about 45% for 48 hours in order to increase the level of moisture to that for the 45% relative humidity environment. Next, the desired through-holes for producing vias are mechanically drilled and then the substrate is cleaned by vapor blasting. The substrate is then immersed for about 2 minutes in a 0.05% solution of Reten 210 in 2% $H_2SO_4$ having a pH value of 1. After a rinse in warm deionized water, the substrate is immersed in a seeder bath containing per liter of solution about 1.2 grams of $PdCl_2$, about 80 grams of $SnCl_2 \cdot 2H_2O$, about 85 ml of 37% HCl, about 0.1 grams of a surfactant, and 175 grams of NaCl, with the remainder being water.

The substrate is immersed in the above seeding bath at room temperature for about 3 to about 5 minutes. Subsequently, the substrate is rinsed in deionized water, treated with 8% HCl at room temperature for 10 minutes, rinsed with deionized water for 3 minutes at room temperature, and then vacuum dried for about 30 minutes at 100° C.

The substrate is then heated at 110° C. for about 1.5 hours in order to reduce the moisture content to below about 45% relative humidity. The substrate is then placed in an environment of about 20° C. and 45% relative humidity for about 48 hours in order to obtain equilibrium for a relative humidity of about 45%. A dry layer of T-168 photoresist is laminated onto the substrate.

Next, an illumination mask, the mask area of which corresponds to the negative of a desired circuit pattern, is aligned with a substrate and then the substrate is irradiated through the mask. The developing is followed with a trichloroethane type developer where the seeded areas of the substrate to be plated and corresponding to the desired pattern are exposed.

Next, the exposed areas of the substrate are electrolessly copper plated. There the substrate is first immersed for about 30 minutes in a bath having a temperature of 72° C.±2° C. and containing per liter of solution 8–10 grams $CuSO_4$, 35–55 grams EDTA, 0.1 grams Gafac wetting agent, 2–3 ml formaldehyde in less than 2 ppm of oxygen, with the rest being water. The bath has a pH value of 11.7. Then the substrate is immersed in a second bath that has the same composition as the first bath, except that its oxygen content is 3 ppm and it contains 10–20 ppm cyanide. In this bath, also at a temperature of 72° C.±2° C., the substrate remains 15 hours. Finally, the photoresist mask is stripped with methylene chloride.

Having thus described our invention, what we claim as new and desire to secure by Letters Patent is:

1. A method for treating a reinforced, synthetic, polymer composite which comprises:
   (a) heating the composite at a temperature and for a time sufficient to obtain a moisture content below that for the relative humidity level at which the composite is to be subjected to drilling subsequently;
   and (b) then subjecting the composite to a controlled environment having said relative humidity level for a time sufficient to increase the moisture content of the composite to that for said relative humidity level to thereby obtain a predictable amount of linear expansion.

2. The method of claim 1 wherein said temperature is about 90° C. to about 110° C. and said time in step a is about ½ hour to about 2½ hours, and said relative humidity level is about 35% to about 55%.

3. The method of claim 2 wherein said relative humidity level is about 45%.

4. The method of claim 1 wherein said relative humidity level is about 35% to about 55%.

5. The method of claim 1 wherein said relative humidity level is about 45%.

6. The method of claim 1 wherein said reinforced, synthetic, polymer composite is epoxy resin-glass fiber prepreg.

7. The method of claim 1 which further includes drilling said composite to provide through-holes therein.

8. The method of claim 7 which further includes subjecting the composite after drilling to heating at a temperature and for a time sufficient to obtain a moisture content below that for the relative humidity level at which the composite is to be subsequently subjected during exposure of a photoresist thereon; and then subjecting the composite to a controlled environment having said relative humidity level for a time sufficient to increase the moisture content of the composite to that for said relative humidity level.

9. The method of claim 8 wherein the relative humidity level for said exposure is about the same as that for said drilling.

10. The method of claim 9 wherein the relative humidity level for said exposure is about 35% to about 55%.

11. The method of claim 9 wherein the relative humidity level for said exposure is about 45%.

12. The method of claim 1 wherein said polymer is a cured synthetic polymer.

13. The method of claim 1 wherein said composite is obtained by subjecting a plurality of reinforced synthetic polymer sheets to pressure and temperature conditions sufficient to laminate said sheets together to form said composite.

14. The method of claim 13 wherein said pressure is about 50 psi to about 2000 psi and said temperature is about 150° C. to about 200° C.

15. The method of claim 1 wherein the maximum temperature of claim 1 is below the glass transition temperature of the polymer of the composite.

16. The method of claim 4 wherein the maximum temperature of claim 1 is below the glass transition temperature of the polymer of the composite.

* * * * *